United States Patent [19]

Nagano

[11] 4,408,190
[45] Oct. 4, 1983

[54] RESISTORLESS DIGITAL-TO-ANALOG CONVERTER USING CASCADED CURRENT MIRROR CIRCUITS

[75] Inventor: Katsumi Nagano, Hiratsuka, Japan

[73] Assignee: Tokyo Shibaura Denki Kabushiki Kaisha, Japan

[21] Appl. No.: 267,536

[22] Filed: May 28, 1981

[30] Foreign Application Priority Data

Jun. 3, 1980 [JP] Japan .................................. 55-74573

[51] Int. Cl.³ .............................................. H03K 13/05
[52] U.S. Cl. .............................. 340/347 DA; 307/297; 340/347 M; 323/315; 330/257; 330/288
[58] Field of Search ................... 340/347 M, 347 DA; 330/288, 257; 323/315, 316; 307/297

[56] References Cited

U.S. PATENT DOCUMENTS 3,290,671 12/1966 Lamoureux ................. 340/347 DA
3,474,440 10/1969 Schmid ....................... 340/347 DA

OTHER PUBLICATIONS

A. B. Grebene, Analog Integrated Circuit Design 327-350, Chapter 10, (1972).
Barker et al., A Precision Active Current-Splitting Circuit Technique, IEEE Journal of Solid-State Circuits 406, vol. SC-11, (1976).

*Primary Examiner*—T. J. Sloyan
*Attorney, Agent, or Firm*—Finnegan, Henderson, Farabow, Garrett & Dunner

[57] ABSTRACT

A digital-to-analog (D/A) converter comprises a plurality of current mirror circuits, a plurality of current switch circuits actuated in response to a digital input signal, and a constant current source.

8 Claims, 7 Drawing Figures

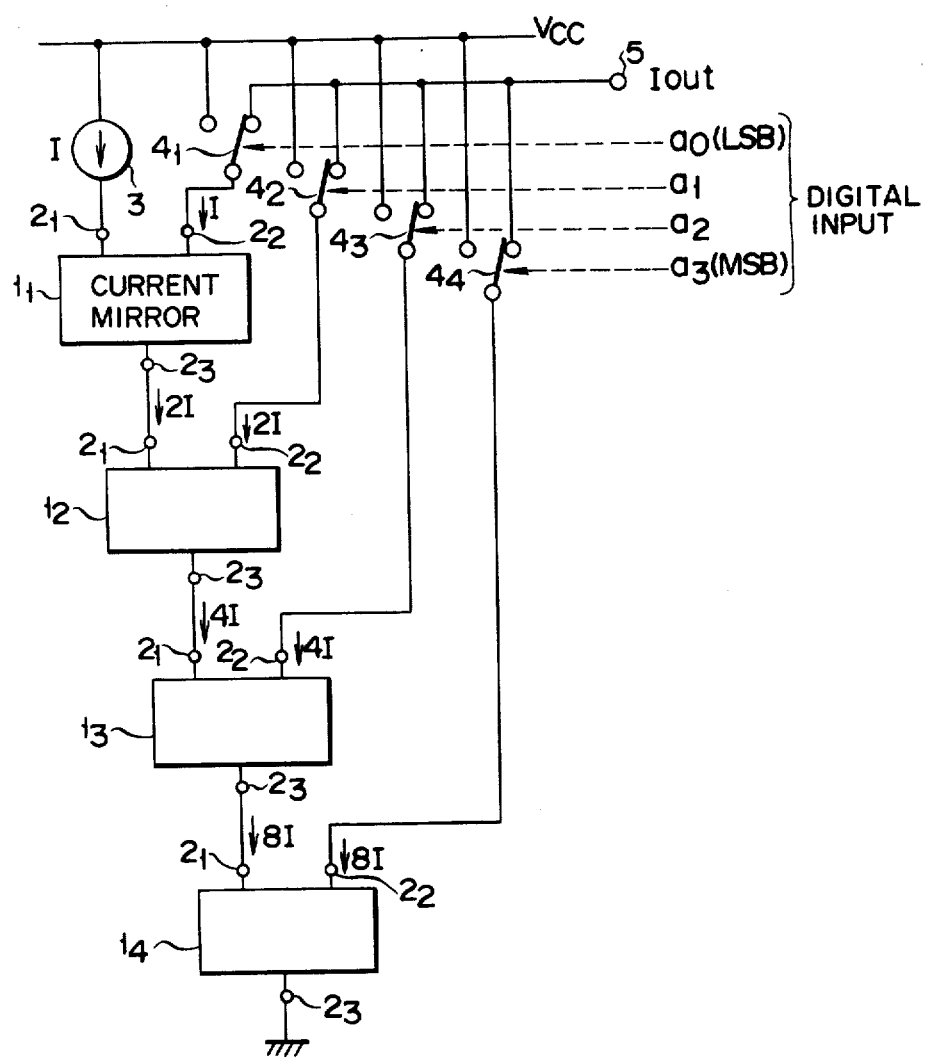
F I G. 1

RESISTORLESS DIGITAL-TO-ANALOG CONVERTER USING CASCADED CURRENT MIRROR CIRCUITS

BACKGROUND OF THE INVENTION

This invention relates to a digital-to-analog converter.

A digital-to-analog (D/A) converter used to date is the type using a ladder resistive network. Unfortunately, this conventional D/A converter has its conversion accuracy considerably affected by the accuracy of resistors used. With such prior art D/A converters, therefore, the size of a digital signal processed by the D/A converter is limited to about 8 bits. High conversion accuracy demands resistors having a high precision. Since high precision resistors require a relatively large area in an integrated circuit, it is necessary to provide a relatively large semiconductor chip for an integrated D/A converter using a ladder resistor network.

SUMMARY OF THE INVENTION

It is accordingly an object of this invention to provide a digital-to-analog converter which is suited for semiconductor integration and can be integrated with an appreciably small area.

To attain the above-mentioned object, this invention provides a digital-analog converter, which comprises a plurality of current mirror circuits whose number corresponds to the number of the bits of an input digital signal to be converted into an analog quantity, each of the current mirror circuits having first, second and third terminals. With the current mirror circuit, when the first terminal is supplied with an input current having a prescribed magnitude, a first output current is obtained at the second terminal which bears a prescribed proportion to the magnitude of the input current at the first terminal, and a second output current is obtained at the third terminal whose magnitude is substantially equal to the sum of the magnitude of the input current at the first terminal and the magnitude of the first output current at the second terminal. With the current mirror circuit, on the other hand, the third terminal may be supplied with an input current having a prescribed magnitude. In this case, there are obtained at the first and second terminals first and second output currents whose magnitudes correspond to the prescribed divisions of the magnitude of the input current at the third terminal.

The plural current mirror circuits are cascade-connected in accordance with the sequential order of the weights of bits of an input digital signal to be converted into an analog quantity in such a manner that the third terminal of the current mirror circuit, which corresponds to one bit, is connected to the prescribed one of the first and second terminals of the current mirror circuit which corresponds to a subsequently significant bit. The one of the first and second terminals of each current mirror circuit other than the above-mentioned prescribed one is selectively connected to an analog output terminal by means of a current switch circuit which is actuated in response to the corresponding bit of the input digital signal. A constant current source is provided which supplies a constant current to the first terminal of a current mirror circuit corresponding to the least significant bit (LSB) or to the third terminal of a current mirror circuit corresponding to the most significant bit (MSB).

BRIEF DESCRIPTION OF THE DRAWINGS

FIG. 1 is a block diagram of a digital-to-analog converter according to one embodiment of this invention;

DETAILED DESCRIPTION OF THE PREFERRED EMBODIMENTS

Referring now to FIG. 1 there is shown a D/A converter according to this invention which is arranged to process a 4-bit input digital signal. This D/A converter is comprised of four current mirror circuits $1_1$ to $1_4$, constant current source 3 and four current switches $4_1$ to $4_4$.

Each of the current mirror circuits $1_1$ to $1_4$ has first, second and third terminals $2_1$, $2_2$ and $2_3$. Where, with each current mirror circuit of the first embodiment, the first terminal (input terminal) $2_1$ is supplied with an input current having a prescribed magnitude, there is obtained at the second terminal (output terminal) $2_2$ an output current having the same magnitude as that of the input current (obtained by multiplying the magnitude of the input current by a coefficient of 1). From the third terminal $2_3$ (output terminal) is drawn an output current having a magnitude twice as large as that of the input current (corresponding to a sum of the magnitude of the input current and the magnitude of the output current from the second terminal $2_2$). The later described third embodiment (FIG. 6) is so arranged that when the third terminal (input terminal) $2_3$ of the current mirror circuit is impressed with a current having a prescribed magnitude, there are obtained at the first and second terminals $2_1$ and $2_2$ (output terminals) output currents whose magnitude is equal to half that of the input current.

The above-mentioned four current mirror circuits of the first embodiment are cascade connected, such that the third terminal $2_3$ of one current mirror circuit is connected to the first terminal $2_1$ of another current mirror circuit.

A constant current source 3 for supplying a constant current I is connected between the first terminal $2_1$ of the first stage current mirror circuit $1_1$ (corresponding to the LSB of the 4-bit digital signal) and a supply terminal of a positive voltage $+V_{cc}$. The third terminal $2_3$ of the last stage current mirror circuit $1_4$ (corresponding to the MSB of the 4-bit digital signal) is connected to a reference potential point (ground).

The four current switches $4_1$ to $4_4$ indicated in the form of single-pole double-throw switches are respectively connected to the second terminals $2_2$ of the current mirror circuits $1_1$ to $1_4$ so as to selectively connect the second terminal $2_2$ of each of the current mirror circuits $1_1$ to $1_4$ to the positive voltage supply terminal or an analog signal output terminal 5 in accordance with the logic state of each of the four bits $a_0$ (LSB), $a_1$, $a_2$ and $a_3$ (MSB) of the 4-bit input digital signal.

Figure 2:
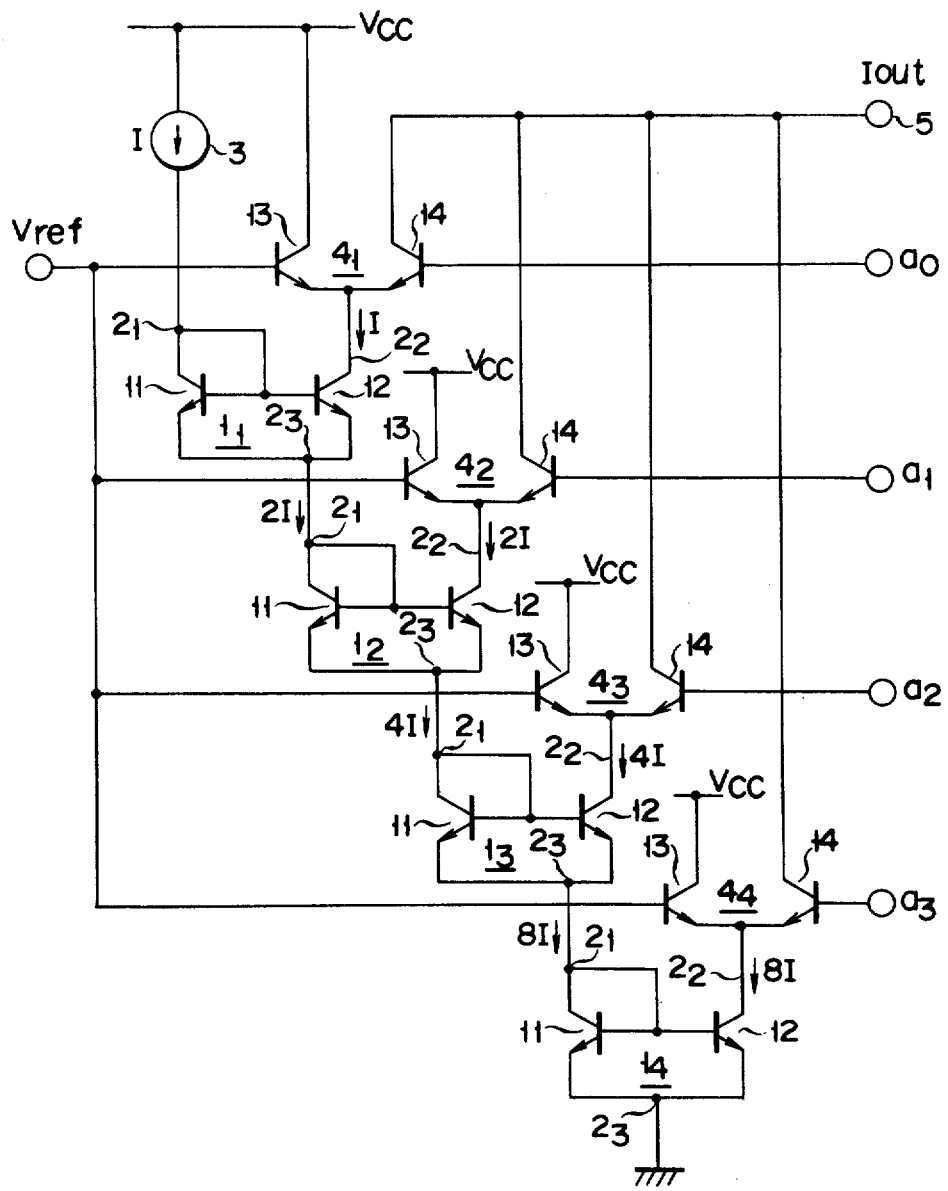
FIG. 2 shows a practical circuit arrangement of the digital-to-analog converter of FIG. 1.

FIG. 2 shows a practical circuit arrangement of the D/A converter of FIG. 1. Each of the four current mirror circuits $1_1$ to $1_4$ comprises a pair of NPN transistors 11 and 12 connected in the form of the known current mirror configuration. More specifically, the transistors 11 and 12 have their bases connected together and their emitters connected together. The transistor 11 is diode-connected such that its base is shunted to its collector. The collector of transistor 11 corresponds to the first terminal $2_1$; the collector of transistor 12 corresponds to the second terminal $2_2$; and the connection point of the emitters of transistors 11, 12 corresponds to the third terminal $2_3$.

Each of the current switches $4_1$ to $4_4$ comprises a pair of NPN type transistors 13 and 14 having their emitters connected together to the second terminal $2_2$ of a corresponding current mirror circuit. In each current switch circuit, the transistor 13 has its collector connected to the positive voltage ($V_{cc}$) supply terminal, and the transistor 14 has its collector connected to the analog signal output terminal 5. The transistors 13 of the current mirror circuits $4_1$ to $4_4$ have their bases connected to receive a common positive reference voltage $V_{ref}$ lower than $V_{cc}$, and the transistors 14 have their bases connected to receive the bit signals $a_0$, $a_1$, $a_2$ and $a_3$, respectively.

With the above-mentioned circuit arrangement of FIG. 2, either one of the paired NPN transistors 11 and 12 of each of the four current switch circuits $4_1$ to $4_4$ is always rendered conducting. Since, under this condition, the first terminal $2_1$ of the current mirror circuit $1_1$ receives current I from the current source 3, the current I flows into the second terminal $2_2$ of current mirror circuit $1_1$, and the current 2I is drawn from the third terminal $2_3$ of current mirror circuit $1_1$. The current 2I drawn from the third terminal $2_3$ of the first stage current mirror circuit $1_1$ is delivered to the first terminal $2_1$ of the second stage current mirror circuit $1_2$. Therefore, the current 2I flows into the second terminal $2_2$ of second stage current mirror circuit $1_2$, and current 4I is drawn out of the third terminal $2_3$ of second stage current mirror circuit $1_2$. Since the current 4I is input current to the third stage current mirror circuit $1_3$, current 4I flows into the second terminal $2_2$ of the third stage current mirror circuit $1_3$ and current 8I is drawn from the third terminal $2_3$ of third stage current mirror circuit $1_3$. In the last stage current mirror circuit $1_4$ the current 8I flows to the second terminal $2_2$.

Figure 3:
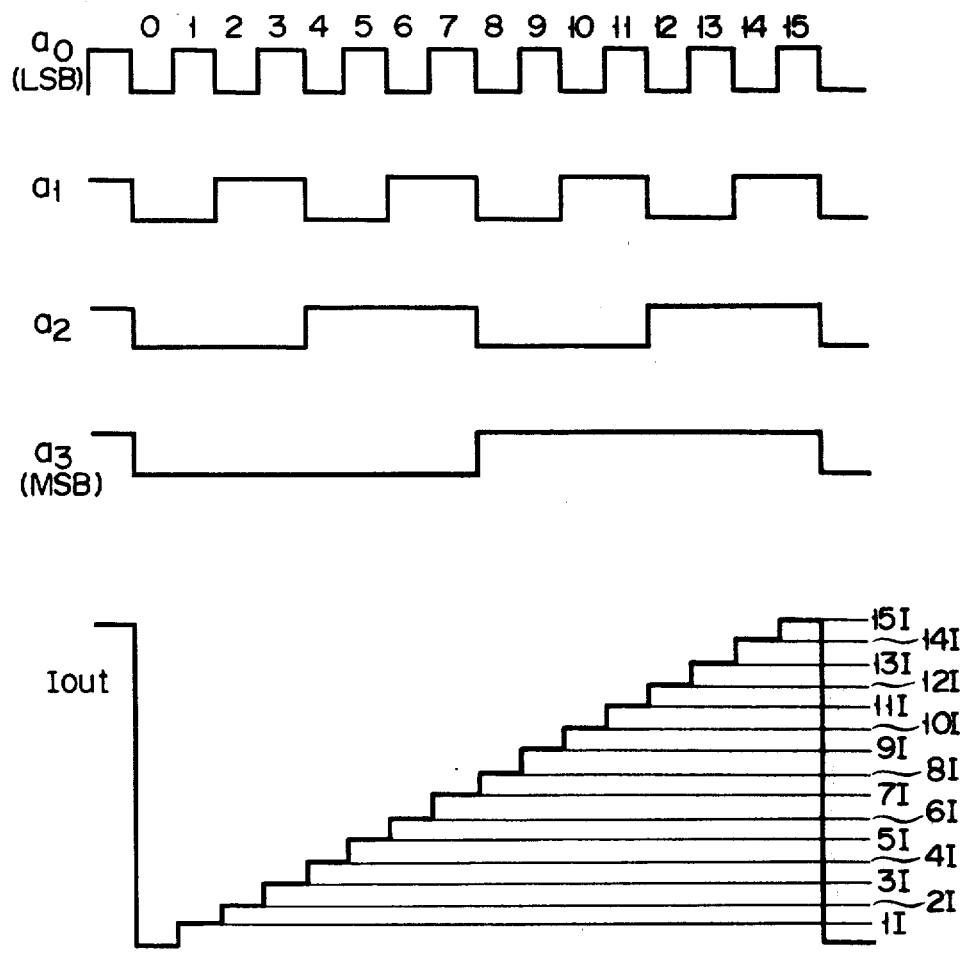
FIG. 3 is a timing chart for explaining the operation of the digital-to-analog converter of FIG. 2.

Description is now given with reference to the timing chart of FIG. 3 of the operation of the D/A converter of FIG. 2. Now let it be assumed that an input digital signal is "0", namely, its bit signals $a_0$, $a_1$, $a_2$, $a_3$ all have a logic level of "0" (a lower potential level than the reference voltage level $V_{ref}$). Then the transistor 13 of each of the current switch circuits $4_1$ to $4_4$ is rendered conducting. As a result, current entering the second terminal $2_2$ of each current mirror circuit flows through the transistor 13, causing an output current $I_{out}$ flowing through the output terminal 5 to become 0.

Where the input digital signal becomes "1", namely, only the LSB signal $a_0$ has a logic level of 1 (a higher potential level than the reference voltage $V_{ref}$), then the transistor 14 of the current switch circuit $4_1$ is rendered conducting. Since, at this time, the bit signal $a_0$ has a higher potential level than the reference voltage $V_{ref}$, the transistor 13 is rendered nonconducting. Therefore, the current I flowing to the second terminal $2_2$ of the first stage current mirror circuit $1_1$ flows through the transistor 14, causing the output current $I_{out}$ to have a magnitude of I.

Where the input digital signal becomes "2", namely, only the bit signal $a_1$ has a logic level of "1", then the transistor 14 of the current switch $4_2$ is rendered conducting, and the transistor 13 thereof is rendered nonconducting. At this time, the transistor 14 of the current switch circuit $4_1$ is rendered nonconducting, and the transistor 13 thereof is rendered conducting. Therefore, the output current $I_{out}$ has a magnitude of 2I.

Where an input digital signal is 3, namely, only the bit signals $a_0$, $a_1$ have a logic level of "1", then the transistors 14 of the current switch circuits $4_1$ and $4_2$ are rendered conducting. As a result, the output current $I_{out}$ has a magnitude of 3I equal to a sum of the magnitudes of currents I and 2I respectively entering the second terminals $2_2$ of the first and second stage current mirror circuits $1_1$, $1_2$.

Similarly, as the input digital signal is successively raised by 1, the output signal $I_{out}$ has its magnitude successively increased by I. Last when the input digital signal reaches 15, namely when the bit signals $a_0$, $a_1$, $a_2$ and $a_3$ all have a logic level of "1", then the transistors 14 of the first to fourth current switch circuits $4_1$ to $4_4$ are all rendered conducting. As a result, an output current $I_{out}$ has a magnitude of 15I equal to a sum of the aforementioned magnitudes I, 2I, 4I, 8I.

As seen from the foregoing description, the output current $I_{out}$ is expressed by the following general formula:

$$I_{out} = (a_0 2a_1 + 4a_2 + 8a_3)I \quad (1)$$

It will be seen from the above general formula that the output current $I_{out}$ is an analog quantity proportional to a magnitude of a 4-bit input digital signal.

The D/A converter of FIG. 2 which does not comprise any resistor is very suited for semiconductor integration, making the chip size of an integrated D/A converter extremely small. A D/A converter embodying this invention can be integrated on a square silicon semiconductor substrate, one side of which measures, for example, 0.7 to 0.8 mm.

The following Table I indicates the actual measured values of the magnitude of output analog current $I_{out}$ produced from the circuit of FIG. 2 under a condition of $V_{cc} = 14$ V, $V_{ref} = 7$ V and I = 32.9 $\mu$A. Table I also indicates calculated values and percentage errors. With the actual measured value denoted by A and the calculated value by B, then percentage error C is expressed as follows:

$$C = \frac{A - B}{B} \times 100 (\%) \quad (2)$$

TABLE I

| Input Digital Signal | | | | Output Analog Signal $I_{out}$ | | |
|---|---|---|---|---|---|---|
| $a_3$ | $a_2$ | $a_1$ | $a_0$ | Measured Value ($\mu$A) | Calculated Value ($\mu$A) | Percentage Error (%) |
| 0 | 0 | 0 | 0 | 0 | 0 | 0 |
| 0 | 0 | 0 | 1 | 31 | 32.9 | −5.89 |
| 0 | 0 | 1 | 0 | 65 | 65.9 | −1.34 |
| 0 | 0 | 1 | 1 | 99 | 98.8 | 0.18 |
| 0 | 1 | 0 | 0 | 131 | 131.8 | −0.58 |
| 0 | 1 | 0 | 1 | 167 | 164.7 | 1.40 |
| 0 | 1 | 1 | 0 | 202 | 197.6 | 2.23 |

TABLE I-continued

| Input Digital Signal | | | | Output Analog Signal $I_{out}$ | | |
|---|---|---|---|---|---|---|
| $a_3$ | $a_2$ | $a_1$ | $a_0$ | Measured Value (µA) | Calculated Value (µA) | Percentage Error (%) |
| 0 | 1 | 1 | 1 | 238 | 230.6 | 3.21 |
| 1 | 0 | 0 | 0 | 276 | 263.5 | 4.74 |
| 1 | 0 | 0 | 1 | 314 | 296.5 | 5.90 |
| 1 | 0 | 1 | 0 | 349 | 329.4 | 5.95 |
| 1 | 0 | 1 | 1 | 387 | 362.3 | 6.81 |
| 1 | 1 | 0 | 0 | 415 | 395.3 | 4.98 |
| 1 | 1 | 0 | 1 | 454 | 428.2 | 6.03 |
| 1 | 1 | 1 | 0 | 490 | 461.2 | 6.23 |
| 1 | 1 | 1 | 1 | 529 | 494.1 | 7.06 |

Figure 4:
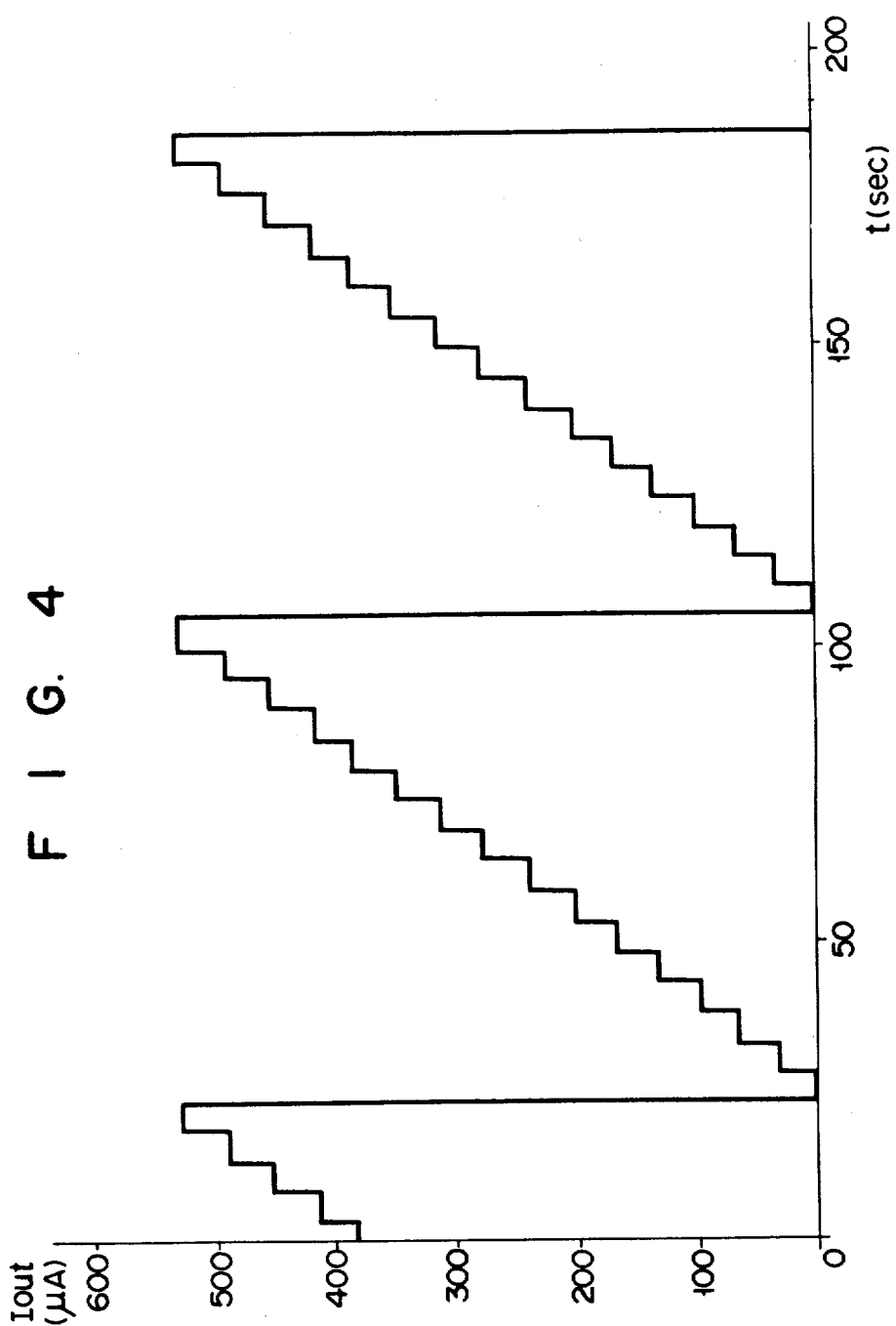
FIG. 4 is a waveform diagram for explaining the operation of the digital-to-analog converter of FIG. 2.

FIG. 4 is a co-ordinate system of measured values shown in Table I above, in which time t (sec) is shown on the abscissa, and a magnitude (µA) of output current $I_{out}$ is set forth on the ordinate.

Table I shows that the percentage errors fall within the range of ±10% over the whole range of the magnitude of an input digital signal. This means that the circuit arrangement of FIG. 2 according to a first embodiment of this invention carries out digital-to-analog conversion with an extremely high accuracy.

Analysis is now made of percentage errors occurring in the circuit of FIG. 2. Now let it be assumed that the current transfer ratio of the current mirror circuits $I_1$ to $I_4$ (a ratio of the output current at the second terminal $2_2$ to the input current at the first terminal $2_1$) is expressed as follows:

$$1 - \frac{2}{\beta}$$

where β represents the common-emitter current gain of transistors 11 and 12. Then currents flowing to the second terminals $2_2$ of the current mirror circuits $1_1$ to $1_4$ do not respectively have magnitudes of I, 2I, 4I, 8I, but $$\left(1 - \frac{2}{\beta}\right) I, 2\left(1 - \frac{3}{\beta}\right) I,$$

$$4\left(1 - \frac{4}{\beta}\right) I \text{ and } 8\left(1 - \frac{5}{\beta}\right) I.$$

Therefore, the result errors respectively indicate $$-\frac{2}{\beta}, -\frac{3}{\beta}, -\frac{4}{\beta} \text{ and } -\frac{5}{\beta}.$$

With β taken to be 100, errors in the magnitude of output current for each bit are −2%, −3%, −4% and −5%.

The following Table II shows percentage errors actually determined with respect to input digital signals having prescribed magnitudes and calculated percentage errors.

TABLE II

| Input Digital Signal | | | | Percentage Errors (%) | |
|---|---|---|---|---|---|
| $a_3$ | $a_2$ | $a_1$ | $a_0$ | Measured Value | Calculated Value |
| 0 | 0 | 0 | 1 | −5.89 | −2 |
| 0 | 0 | 1 | 0 | −1.34 | −3 |
| 0 | 1 | 0 | 0 | −0.58 | −4 |
| 1 | 0 | 0 | 0 | +4.74 | −5 |

Table II above shows that with the most significant bit, a wide difference appears between both percentage errors. This means that errors in the more significant bits are not determined merely by β (common-emitter current gain of the transistors 11, 12). The reason for this is that the collector-emitter voltage of the transistor 12 of the fourth current mirror circuit $I_4$, corresponding to the most significant bit (MSB), gets higher than the collector-emitter voltage of the transistor 12 of another current mirror circuit, for example, the third current mirror circuit $I_3$. Thus the Early effect of the transistor 12 of the fourth current mirror circuit $I_4$ becomes great.

Figure 5:
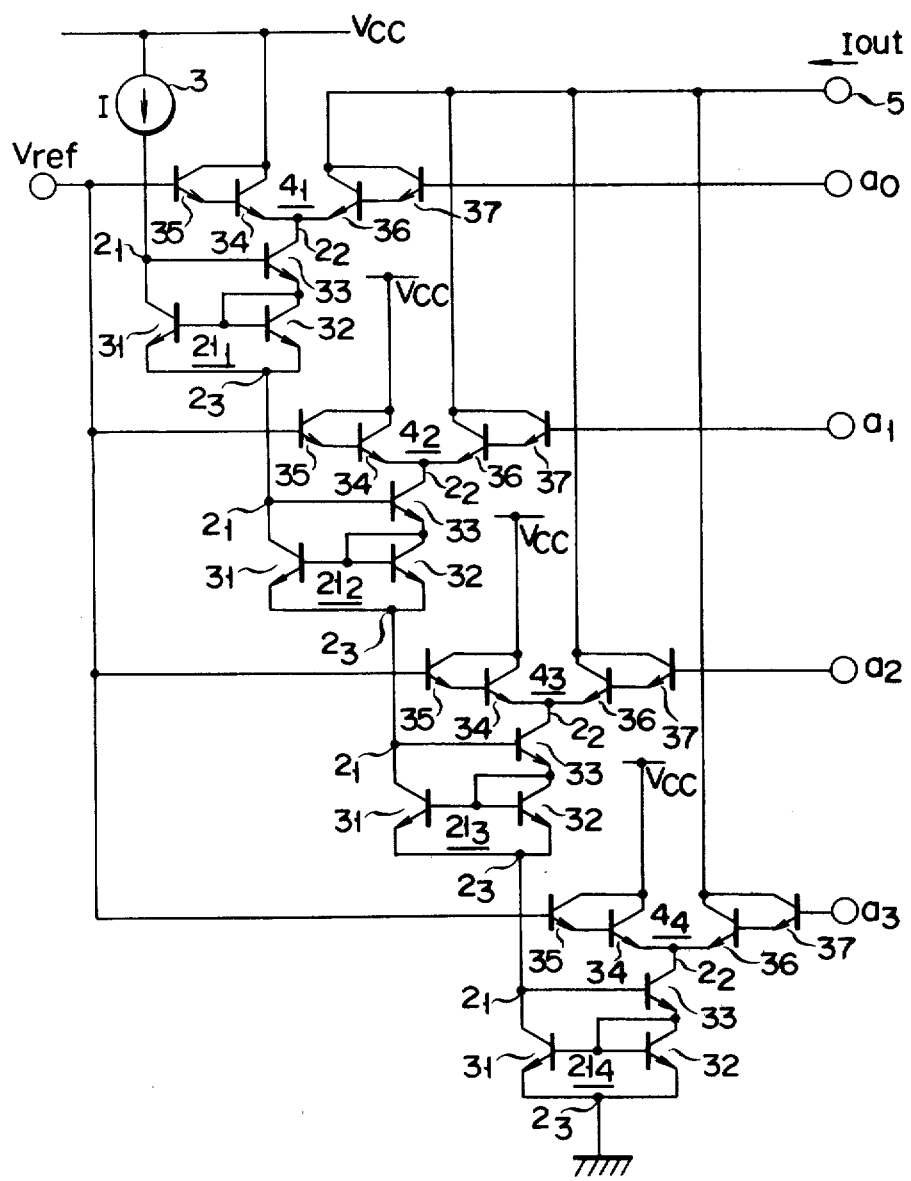
FIGS. 5 and 6 are circuit diagrams of digital-to-analog converters according to other embodiments of the invention.

Description is now given with reference to FIG. 5 of a D/A converter according to a second embodiment of this invention. This second embodiment uses a current mirror circuit referred to as "a Willson source circuit" in order to reduce the above-mentioned Early effect. Each of four current mirror circuits $21_1$ to $21_4$ comprises NPN transistors 31, 32, 33. The transistors 31 and 32 have their bases connected together and their emitters connected together. The transistor 32 has its collector shunted to its base. The base and emitter of the transistor 33 are respectively connected to the collectors of the transistors 31 and 32. The collector of the transistor 31 corresponds to the first terminal $2_1$. The collector of the transistor 33 corresponds to the second terminal $2_2$. The common emitter junction of the transistors 31 and 32 corresponds to the third terminal $2_3$.

To elevate the operation precision of the current switch circuits $4_1$ to $4_4$, the second embodiment of FIG. 5 uses Darlington-connected NPN transistor pairs 34-35; 36-37 instead of the previously mentioned transistors 13 and 14. The arrangement of the second embodiment of FIG. 5 reduces percentage errors in the magnitude of output current $I_{out}$ to about ±1%.

Figure 6:
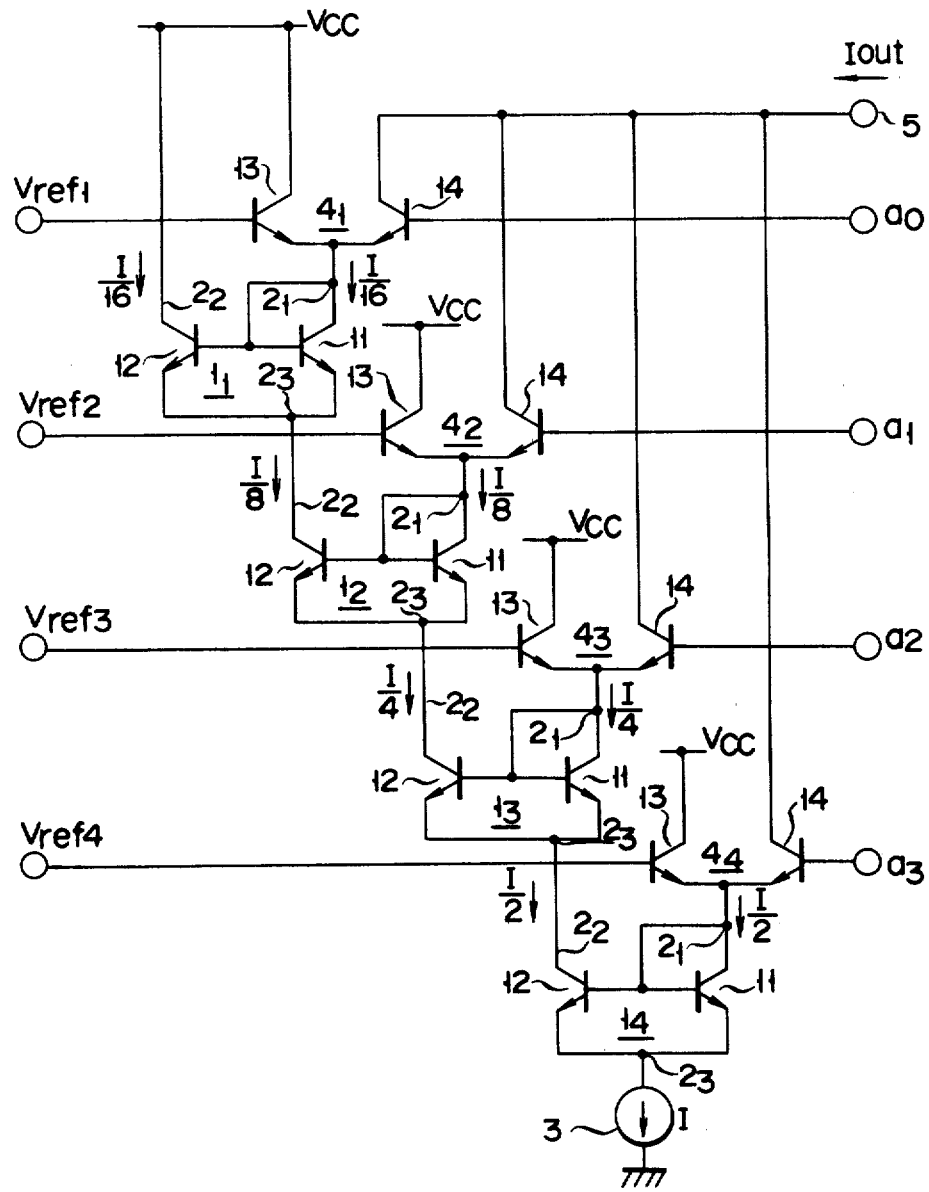

Description is now given with reference to FIG. 6 of a D/A converter according to a third embodiment of this invention. With this third embodiment, the current source 3 is connected between the third terminal $2_3$ of the MSB current mirror circuit $1_4$ and circuit ground, thereby supplying an input current to the third terminal (input terminal) $2_3$ of the respective current mirror circuits $1_1$ to $1_4$. With the third embodiment of FIG. 6, the third terminal $2_3$ of each of the current mirror circuits $1_1$ to $1_4$ is connected to the second terminal (output terminal) $2_2$ of each adjacent current mirror circuit. The first terminal (output terminal) $2_1$ of each of the current mirror circuits $1_1$ to $1_4$ is connected to the corresponding current switch circuit. With the third embodiment of FIG. 6, the bases of the transistors 13 of the four current switch circuits $4_1$ to $4_4$ are respectively connected to the different reference voltage terminals $V_{ref1}$, $V_{ref2}$, $V_{ref3}$ and $V_{ref4}$. It is preferred that the magnitudes of these different reference voltages be arranged as follows in respect to magnitude:

$$V_{cc} \geq V_{ref1} \geq V_{ref2} \geq V_{ref3} \geq V_{ref4}$$

With the circuit of FIG. 6, an output current of the current source 3 has a magnitude of I. Therefore, the first and second terminals $2_1$, $2_2$ of the fourth current mirror circuit $1_4$ are supplied with a current having half the magnitude of the output current. This I/2 current is delivered to the third terminal $2_3$ of the third current mirror circuit $1_3$. Therefore, the first and second terminals $2_1$ and $2_2$ of the third current mirror circuit $1_3$ are respectively supplied with a current having a magnitude of I/4. This I/4 current is delivered to the third terminal $2_3$ of the second current mirror circuit $1_2$. Therefore, the first and second terminals $2_1$, $2_2$ of the second current mirror circuit $1_2$ are respectively supplied with a current having a magnitude of I/8. This I/8 current is conducted to the third terminal $2_3$ of the first current mirror circuit $1_1$. Therefore, the first and second terminals $2_1$, $2_2$ of the first current mirror circuit $1_1$ are respectively supplied with a current having a magnitude of I/16. As a result, the output current $I_{out}$ from the output terminal 5 has a magnitude expressed by the following equation:

$$I_{out} = (a_0 + 2a_1 + 4a_2 + 8a_3)\frac{I}{16} \qquad (3)$$

The above equation (3) is differentiated from the previously mentioned equation (1) only by a constant of proportion. Therefore, the third embodiment of FIG. 6 produces an analog quantity proportional to the magnitude of an input digital signal.

It will be noted that this invention is not limited by the foregoing embodiments. For instance, the number of bits constituting an input digital signal is not obviously limited to 4. The analog quantity is supplied not only by current, but also is produced in the form of voltage by connecting a suitable impedance element such as a resistor to the output terminal 5.

Throughout the circuit arrangements of the foregoing embodiments, an output current at the second terminal $2_2$ of each current mirror circuit has a magnitude obtained by multiplying the magnitude of an input current at the first terminal $2_1$ of each current mirror circuit by 1. In other words, the current transfer ratio stands at 1:1. However, this invention is not limited to this arrangement. For instance, it is possible to vary the current transfer ratio of each current mirror circuit as shown in FIG. 7 by causing the emitters of a pair of transistors of each current mirror circuit to have different areas.

Figure 7:
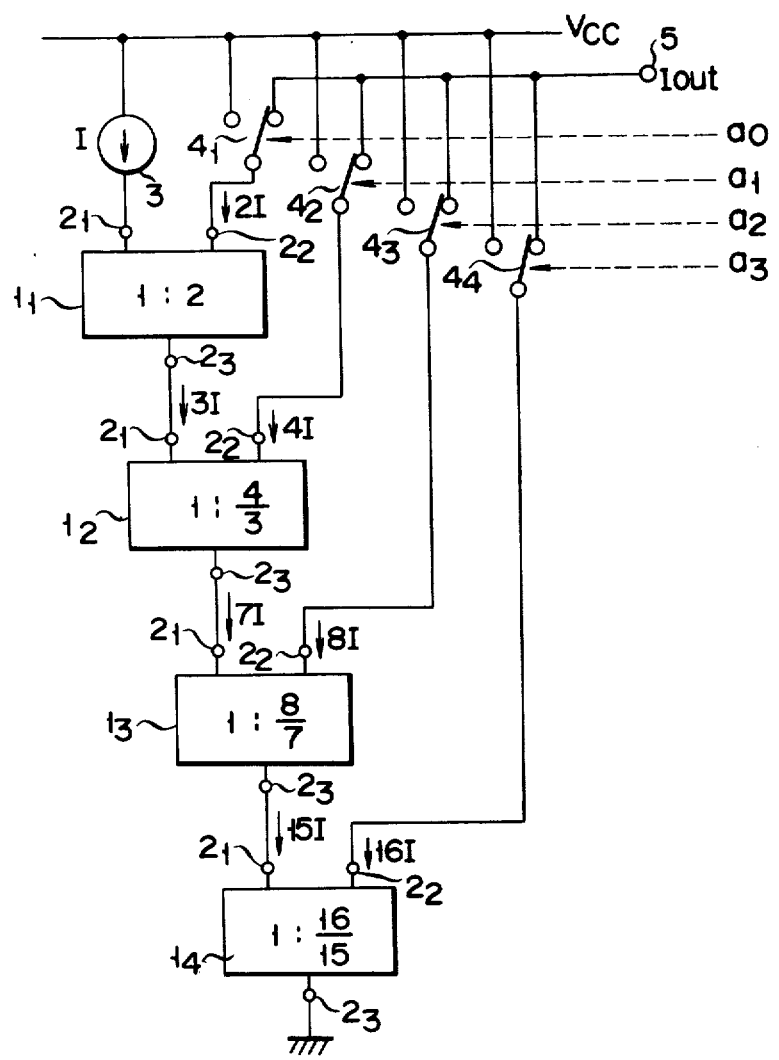
FIG. 7 is a circuit diagram of a digital-to-analog converter according to still another embodiment of the invention.

In the circuit of FIG. 7, the output current $I_{out}$ has a magnitude expressed as follows:

$$I_{out}=(a_0+2a_1+4a_2+8a_3)\times 2I \qquad (4)$$

What is claimed is:

1. A digital-to-analog converter for converting an input digital signal consisting of a plurality of bits into an analog quantity at an output terminal, said converter comprising:
   a two-terminal constant current source having a first terminal connected to a supply voltage;
   a plurality of current mirror circuits each corresponding to a different one of said plurality of bits in said input digital signal,
      each of said current mirror circuits including first, second and third terminals, said first terminal receiving a current whose magnitude bears a prescribed ratio to a current at said second terminal, and said third terminal having a current whose magnitude is substantially equal to the sum of said currents at said first and second terminals,
   said current mirror circuits being connected such that the third terminal of a current mirror circuit corresponding to one of said bits is connected to the first terminal of the current mirror circuit corresponding to the next most significant bit, the third terminal of the current mirror circuit corresponding to the most significant bit of said input digital signal being connected to ground and the first terminal of the current mirror circuit corresponding to the least significant bit of said digital signal being connected to a second terminal of said constant current source; and
   a plurality of current switch circuits each controlled by a different one of said plurality of bits in said input digital signal and each of said current switch circuits selectively connecting to said output terminal, in response to the state of the connected bit, the second terminal of the current mirror circuit corresponding to the controlling bit,
      each of said switches including first and second transistors whose emitters are connected together to the second terminal of the corresponding current mirror circuit, the base of said first transistor being coupled to said controlling bit of said input digital signal, a collector of said first transistor being connected to said output terminal, a collector of said second transistor being connected to said supply voltage and the base of said second transistor being connected to a reference voltage.

2. A digital-to-analog converter according to claim 1, wherein each of said current mirror circuits comprises third and fourth transistors each having a base, collector and emitter, said third and fourth transistors having their bases connected together and their emitters connected together, the base of said third transistor being shunted to its collector, and the collector of said third transistor, the collector of said fourth transistor, and the emitters of said third and fourth transistors respectively constituting said first, second and third terminals.

3. A digital-to-analog coverter according to claim 1, wherein each of said current mirror circuits comprises third, fourth and fifth transistors each having a base, collector and emitter, said third and fourth transistors having their bases connected together and their emitters connected together, said fourth transistor having its base shunted to its collector, said fifth transistor having its base connected to the collector of said third transistor and its emitter connected to the collector of said fourth transistor, and the collector of said third transistor, the collector of said fifth transistor and the emitters of said third and fourth transistors constituting said first, second and third terminals of each current mirror circuit.

4. A digital-to-analog converter according to claim 1, wherein each of said paired transistors is a Darlington-connected transistor pair.

5. A digital-to-analog converter for converting an input digital signal consisting of a plurality of bits into an analog quantity at an output terminal, said converter comprising:
   a two-terminal constant current source having a first terminal connected to ground;
   a plurality of current mirror circuits each corresponding to a different one of said plurality of bits in said input digital signal,
      each of said current mirror circuits including first, second and third terminals, said first terminal receiving a current whose magnitude bears a prescribed ratio to a current at said second terminal, and said third terminal having a current whose magnitude is substantially equal to the sum of said currents at said first and second terminals, said current mirror circuits being connected such that the third terminal of a current mirror circuit corresponding to one of the bits and said input digital signal is connected to the first terminal of the current mirror circuit corresponding to the next most significant bit, the third terminal of said current mirror circuit corresponding to the most significant bit of said input digital signal being connected to a second input terminal of said constant current source and the first terminal of the current mirror circuit corresponding to the least significant bit of said input digital signal being connected to a supply voltage; and a plurality of current switch circuits each controlled by a different one of said plurality of bits in said input digital signal and each of said current switch circuits selectively connecting to said output terminal, in response to the state of the connected bit, the second terminal of the current mirror circuit corresponding to the controlling bit, each of said switches also including first and second transistors whose emitters are connected together and to the second terminal of the corresponding current mirror circuit, the base of the first transistor being coupled to said controlling bit of said input digital signal, the collector of said first transistor being connected to said output terminal, the collector of said second transistor being connected to said supply voltage, and the base of said second transistor being connected to a reference voltage different from the reference voltage at the base of a transistor in another of said current switch circuits.

6. A digital-to-analog converter according to claim 5 wherein each of said current mirror circuits comprises third and fourth transistors each having a base, collector and emitter, said third and fourth transistors having their bases connected together and their emitters connected together, the base of said first transistor being shunted to its collector, and the collector of said first transistor, the collector of said second transistor, and the emitters of said first and second transistors respectively constituting said first, second and third terminals.

7. A digital-to-analog converter according to claim 5 wherein each of said current mirror circuits comprises third, fourth, and fifth transistors each having a base, collector and emitter, said third and fourth transistors having their bases connected together and their emitters connected together, said fourth transistor having its base shunted to its collector, said fifth transistor having its base connected to the collector of said third transistor and its emitter connected to the collector of said fourth transistor, and the collector of said third transistor, the collector of said fifth transistor, the emitters of said third and fourth transistors constituting said third, fourth and fifth terminals.

8. A digital-to-analog converter according to claim 5 wherein each of said paired transistors is a Darlington-connected transistor pair.

* * * * *